(12) United States Patent
Chen et al.

(10) Patent No.: US 10,169,685 B2
(45) Date of Patent: Jan. 1, 2019

(54) AUTOMATIC SEGMENTATION AND QUANTITATIVE PARAMETERIZATION OF BRAIN TUMORS IN MRI

(71) Applicant: The Regents of the University of California, Oakland, CA (US)

(72) Inventors: Clark Chen, La Jolla, CA (US); Tyler Steed, San Diego, CA (US); Bob S. Carter, San Diego, CA (US); Anders M. Dale, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 61 days.

(21) Appl. No.: 15/323,530

(22) PCT Filed: Jul. 7, 2015

(86) PCT No.: PCT/US2015/039385
§ 371 (c)(1),
(2) Date: Jan. 3, 2017

(87) PCT Pub. No.: WO2016/007518
PCT Pub. Date: Jan. 14, 2016

(65) Prior Publication Data
US 2017/0147908 A1    May 25, 2017

Related U.S. Application Data

(60) Provisional application No. 62/021,532, filed on Jul. 7, 2014.

(51) Int. Cl.
*G06T 7/11* (2017.01)
*G06K 9/62* (2006.01)
(Continued)

(52) U.S. Cl.
CPC ....... *G06K 9/6276* (2013.01); *G01R 33/5608* (2013.01); *G06K 9/6254* (2013.01);
(Continued)

(58) Field of Classification Search
CPC ......... G01R 33/5608; G06K 2209/051; G06K 9/6276; G06K 9/6277; G06T 2207/10088;
(Continued)

(56) References Cited

U.S. PATENT DOCUMENTS

2006/0257027 A1    11/2006 Hero et al.
2007/0108976 A1    5/2007 Morich et al.
(Continued)

OTHER PUBLICATIONS

Anbeek et al., "Automatic segmentation of eight tissue classes in neonatal brain MRI", PloS one 2013, 8, e81895.
(Continued)

*Primary Examiner* — Siamak Harandi
(74) *Attorney, Agent, or Firm* — Perkins Coie LLP

(57) ABSTRACT

Techniques, systems, and devices are described for implementing automatic segmentation and quantitative parameterization of MRI images. For example, the disclosed method includes processing the MRI image to correct any distortions; performing a preliminary segmentation of the MRI image to assign a tissue label of a set of tissue labels to one or more preliminary volumes of voxels of the MRI image; comparing each voxel of the MRI image with the one or more preliminary volumes of voxels with an assigned tissue label and assigning each voxel of the MRI image a probability of being associated with each tissue label of the set of tissue labels; and assigning each voxel of the MRI image a tissue label according to its greatest probability among probabilities for each voxel being associated with the set of tissue labels.

21 Claims, 9 Drawing Sheets

(51) Int. Cl.
    *G01R 33/56* (2006.01)
    *G06T 7/00* (2017.01)
    *G06T 7/187* (2017.01)
(52) U.S. Cl.
    CPC .......... *G06K 9/6277* (2013.01); *G06T 7/0012* (2013.01); *G06T 7/11* (2017.01); *G06T 7/187* (2017.01); *G06K 2209/05* (2013.01); *G06K 2209/051* (2013.01); *G06T 2207/10088* (2013.01); *G06T 2207/20081* (2013.01); *G06T 2207/20128* (2013.01); *G06T 2207/30016* (2013.01); *G06T 2207/30096* (2013.01)
(58) Field of Classification Search
    CPC . G06T 2207/20081; G06T 2207/30016; G06T 2207/30096; G06T 7/0012; G06T 7/11; G06T 7/187
    See application file for complete search history.

(56) References Cited

U.S. PATENT DOCUMENTS

| | | |
|---|---|---|
| 2007/0167788 A1 | 7/2007 | Hartlep et al. |
| 2010/0027865 A1 | 2/2010 | Wels et al. |
| 2012/0093381 A1 | 4/2012 | Fan et al. |
| 2013/0223714 A1 | 8/2013 | Lipton et al. |
| 2014/0161334 A1 | 6/2014 | Wang et al. |

OTHER PUBLICATIONS

Anbeek et al., "Probabilistic brain tissue segmentation in neonatal magnetic resonance imaging", Pediatric research 2008, 63, pp. 158-163.
Anbeek et al., "Probabilistic segmentation of brain tissue in MR imaging", NeuroImage 2005, 27, pp. 795-804.
Anbeek et al., "Probabilistic segmentation of white matter lesions in MR imaging", NeuroImage 2004, 21, pp. 1037-1044.
Brennan et al., "The somatic genomic landscape of glioblastoma", Cell 2013, 155, pp. 462-477.
Cerami et al., "Automated network analysis identities core pathways in glioblastoma", PLoS One 2010, 5, e8918.
Dale et al., "Cortical surface-based analysis I. Segmentation and surface reconstruction", NeuroImage 1999, 9, pp. 179-194.
Deeley et al., "Comparison of manual and automatic segmentation methods for brain structures in the presence of space-occupying lesions: a multi-expert study", Physics in Medicine and Biology 2011, 56, pp. 4557-4577.
Diaz et al., "An automatic brain tumor segmentation tool. Conference proceedings", Annual International Conference Engineering in Medicine and Biology Society IEEE Engineering in Medicine and Biology Society 2013, pp. 3339-3342.
Dice, L.R., "Measures of the Amount of Ecologic Association Between Species", Ecology 1945, 26, pp. 297-302.
Diehn et al., "Identification of noninvasive imaging surrogates for brain tumor gene-expression modules", Proc Natl Acad Sci U S A 2008, 105, pp. 5213-5218.
Fischl et al., "Whole brain segmentation: automated labeling of neuroanatomical structures in the human brain", Neuron 2002, 33, pp. 341-355.
Fletcher-Heath et al., "Automatic segmentation of non-enhancing brain tumors in magnetic resonance images", Artificial Intelligence in Medicine 2001, 21, pp. 43-63.
Gordillo et al., "State of the art survey on MRI brain tumor segmentation", Magnetic resonance imaging 2013, 31, pp. 1426-1438.
Grabner et al., "Symmetric atlasing and model based segmentation: an application to the hippocampus in older adults", Medical image computing and computer-assisted intervention: MICCAI International Conference on Medical Image Computing and Computer-Assisted Intervention 2006, 9, pp. 58-66.
Gutman et al., "MR imaging predictors of molecular profile and survival: multi-institutional study of the TCGA glioblastoma data set", Radiology 2013, 267, pp. 560-569.
Harati et al., "Fully automated tumor segmentation based on improved fuzzy connectedness algorithm in brain MR images", Computers in Biology and Medicine 2011, 41, pp. 483-492.
Holland et al., "Efficient correction of inhomogeneous static magnetic field-induced distortion in Echo Planar Imaging", NeuroImage 2010, 50, pp. 175-183.
Iglesias et al., "Robust brain extraction across datasets and comparison with publicly available methods", IEEE transactions on medical imaging 2011, 30, pp. 1617-1634.
Jenkinson et al., "A global optimisation method for robust affine registration of brain images", Medical image analysis 2001, 5, pp. 143-156.
Jenkinson et al., "Improved optimization for the robust and accurate linear registration and motion correction of brain images", NeuroImage 2002, 17, pp. 825-841.
Jenkinson et al., FSL, NeuroImage 2012, 62, pp. 782-790.
Jovicich et al., "Reliability in multi-site structural MRI studies: effects of gradient non-linearity correction on phantom and human data", NeuroImage 2006, 30, pp. 436-443.
Minniti et al., "Chemotherapy for glioblastoma: current treatment and future perspectives for cytotoxic and targeted agents", Anticancer research 2009, 29, pp. 5171-5184.
Omuro et al., "Glioblastoma and other malignant gliomas: a clinical review", JAMA: The journal of the American Medical Association 2013, 310, pp. 1842-1850.
Otsu, "A Threshold Selection Method from Gray-Level Histograms." Systems, Man and Cybernetics, IEEE Transactions on Systems, Man and Cybernetics, 1979, 9, pp. 62-66.
Prastawa et al., "Automatic brain tumor segmentation by subject specific modification of atlas priors", Academic Radiology 2003, 10, pp. 1341-1348.
Smith et al., "Advances in functional and structural MR image analysis and implementation as FSL", NeuroImage 2004, 23 Suppl 1, pp. S208-S219.
Smith, S.M., "Fast robust automated brain extraction", Human brain mapping 2002, 17, pp. 143-155.
Steenwijk et al., "Accurate white matter lesion segmentation by k nearest neighbor classification with tissue type priors (kNN-TTPs)", NeuroImage Clinical 2013, 3, pp. 462-469.
Steed et al., "Iterative Probabilistic Voxel Labeling: Automated Segmentation for Analysis of the Cancer Imaging Archive Glioblastoma Images", Original Research Brain, 2015, pp. 678-685.
Vaidyanathan et al., "Comparison of supervised MRI segmentation methods for tumor volume determination during therapy", Magnetic Resonance Imaging 1995, 13, pp. 719-728.
Verhaak et al., "Integrated genomic analysis identifies clinically relevant subtypes of glioblastoma characterized by abnormalities in PDGFRA, IDH1, EGFR, and NF1", Cancer Cell 2010, 17, pp. 98-110.
Vitucci et al., "Gene expression profiling of gliomas: merging genomic and histopathological classification for personalised therapy", Br J Cancer 2011, 104, pp. 545-553.
Weltens et al. "Interobserver variations in gross tumor volume delineation of brain tumors on computed tomography and impact of magnetic resonance imaging", Radiotherapy and Oncology, 2001, 60, pp. 49-59.
Wen et al., "Malignant gliomas in adults", The New England Journal of Medicine 2008, 359, pp. 492-507.
Woolrich et al., "Bayesian analysis of neuroimaging data in FSL", NeuroImage 2009, 45, pp. S173-S186.
Wu et al., "Semi-automatic segmentation of brain tumors using population and individual information", Journal of Digital Imaging 2013, 26, pp. 786-796.
Zhang et al., "Segmentation of brain MR images through a hidden Markov random field model and the expectation-maximization algorithm", IEEE transactions on medical imaging 2001, 20, pp. 45-57.
Zhu et al., "Semi-automatic segmentation software for quantitative clinical brain glioblastoma evaluation", Academic Radiology 2012, 19, pp. 977-985.

(56) References Cited

OTHER PUBLICATIONS

Zikic et al., "Decision forests for tissue-specific segmentation of high-grade gliomas in multi-channel MR", MICCAI International Conference on Medical Image Computing and Computer-Assisted Intervention 2012;15:369-76.
Zinn et al., "Radiogenomic mapping of edema/cellular invasion MRI-phenotypes in glioblastoma multiforme", PloS one 2011, 6, e25451.
International Search Report and Written Opinion of International Application No. PCT/US2015/039385; dated Sep. 29, 2015.

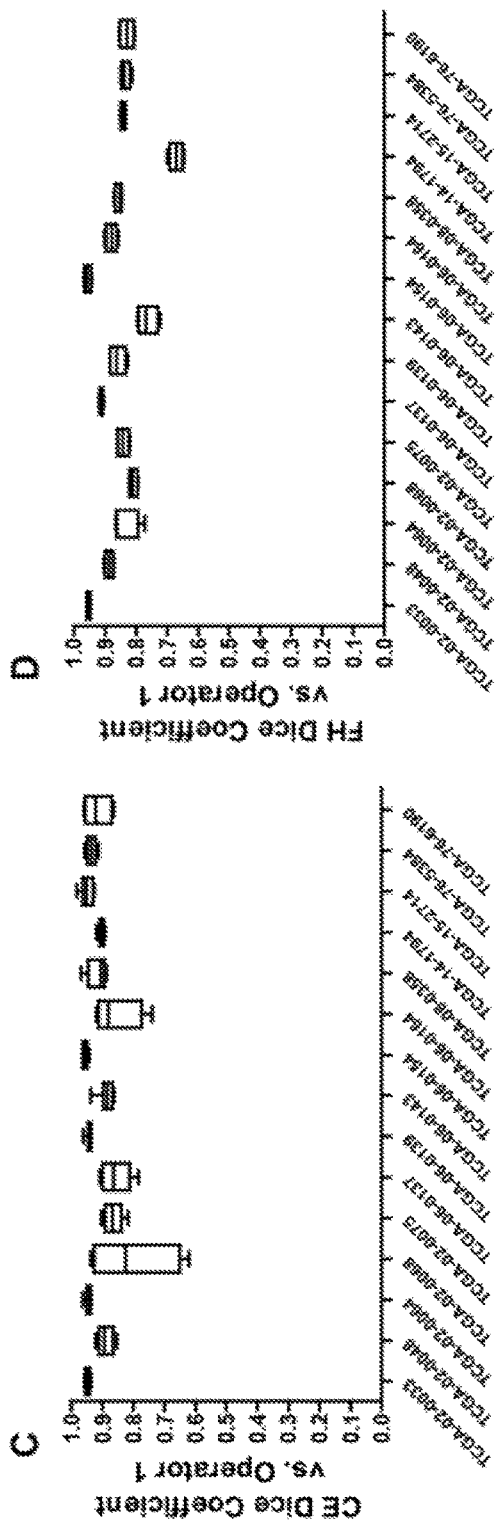
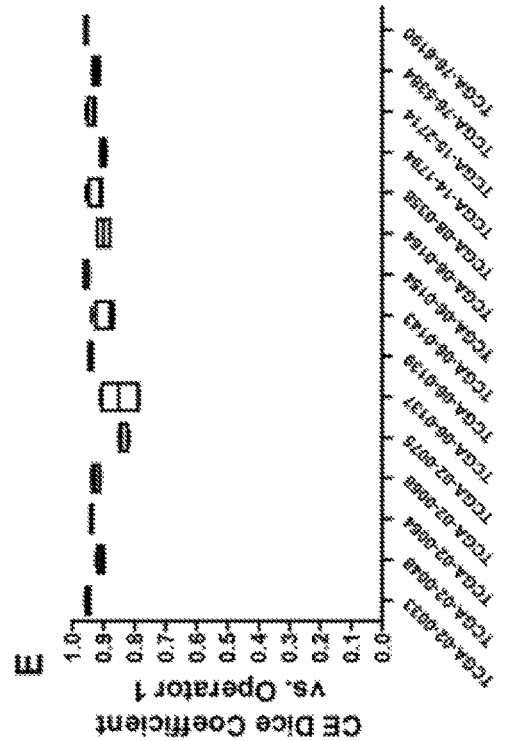
FIG. 4C
FIG. 4D
FIG. 4E

AUTOMATIC SEGMENTATION AND QUANTITATIVE PARAMETERIZATION OF BRAIN TUMORS IN MRI

PRIORITY CLAIM

This patent document is a 35 U.S.C. § 371 National Stage application of International Application No. PCT/US2015/039385, entitled "AUTOMATIC SEGMENTATION AND QUANTITATIVE PARAMETERIZATION OF BRAIN TUMORS IN MRI," which claims the benefit and priorities of U.S. Provisional Patent Application No. 62/021,532, filed on Jul. 7, 2014, and entitled "AUTOMATIC SEGMENTATION AND QUANTITATIVE PARAMETERIZATION OF BRAIN TUMORS IN MRI." The disclosure of the before-mentioned applications are incorporated by reference as part of this patent document.

TECHNICAL FIELD

This patent document relates to systems, devices, and processes for automated segmentation and quantitative analysis of image dataset, in particular Magnetic Resonance Imaging (MRI) dataset.

BACKGROUND

Magnetic Resonance Imaging (MRI) is a medical imaging technique that applies a magnetic field and a pulse or a sequence of pulses of radio frequency (RF) energy to produce MRI images used for characterizing internal biological structures. MRI is based on the property of nuclear magnetic resonance (NMR). NMR is a physical property in which the nuclei of atoms absorb and re-emit electromagnetic energy at a specific resonance frequency in the presence of a magnetic field. The absorption and reemission of energy can be dependent on the strength of the magnetic field and the magnetic property of the atoms (e.g., atoms whose nuclei possesses magnetic spin).

SUMMARY

The subject matter described in this patent document can be implemented in specific ways that provide one or more of the following features. The disclosed methods and systems can be used in robust, automated volume segmentation for quantitative analysis of MRI images. The disclosed methods and systems can identify and label brain tumor-associated pathology using an iterative probabilistic voxel-labeling technique performing k-nearest neighbor (KNN) and Gaussian mixture model (GMM) classification on MRI images.

In one aspect, an automated method for tumor segmentation is disclosed. Sparse high specificity preliminary volumes are created for each subject using a combination of region-growing and k-means based tissue segmentation. Data about voxel intensity and spatial coordinates obtained from sampling preliminary volumes can be used to train k-nearest neighbor (KNN), and Gaussian mixture model (GMM) classifiers. Voxel labels are assigned probabilistically by iteratively trained KNN and GMM classifiers. Finally, each voxel is labeled as contrast enhancing tumor volume (CE), Fluid-attenuated inversion recovery (FLAIR) hyperintensity volume (FH), gray matter (GM), white matter (WM), cerebral spinal fluid (CSF), and blood vessels (BV). Experiment data show that the disclosed methods and systems can reliably label these volumes using images from the TCIA acquired by differing scanners and protocols, to obtain results that are highly consistent with operator-defined volumes. The disclosed methods and systems can expedite quantitative image analysis, surgical planning, and novel discoveries.

BRIEF DESCRIPTION OF THE DRAWINGS

FIGS. 4A, 4B, 4C, 4D and 4E show example of effects of the choice of the sample set for the segmentation.

Like reference symbols and designations in the various drawings indicate like elements.

DETAILED DESCRIPTION

Figure 1:
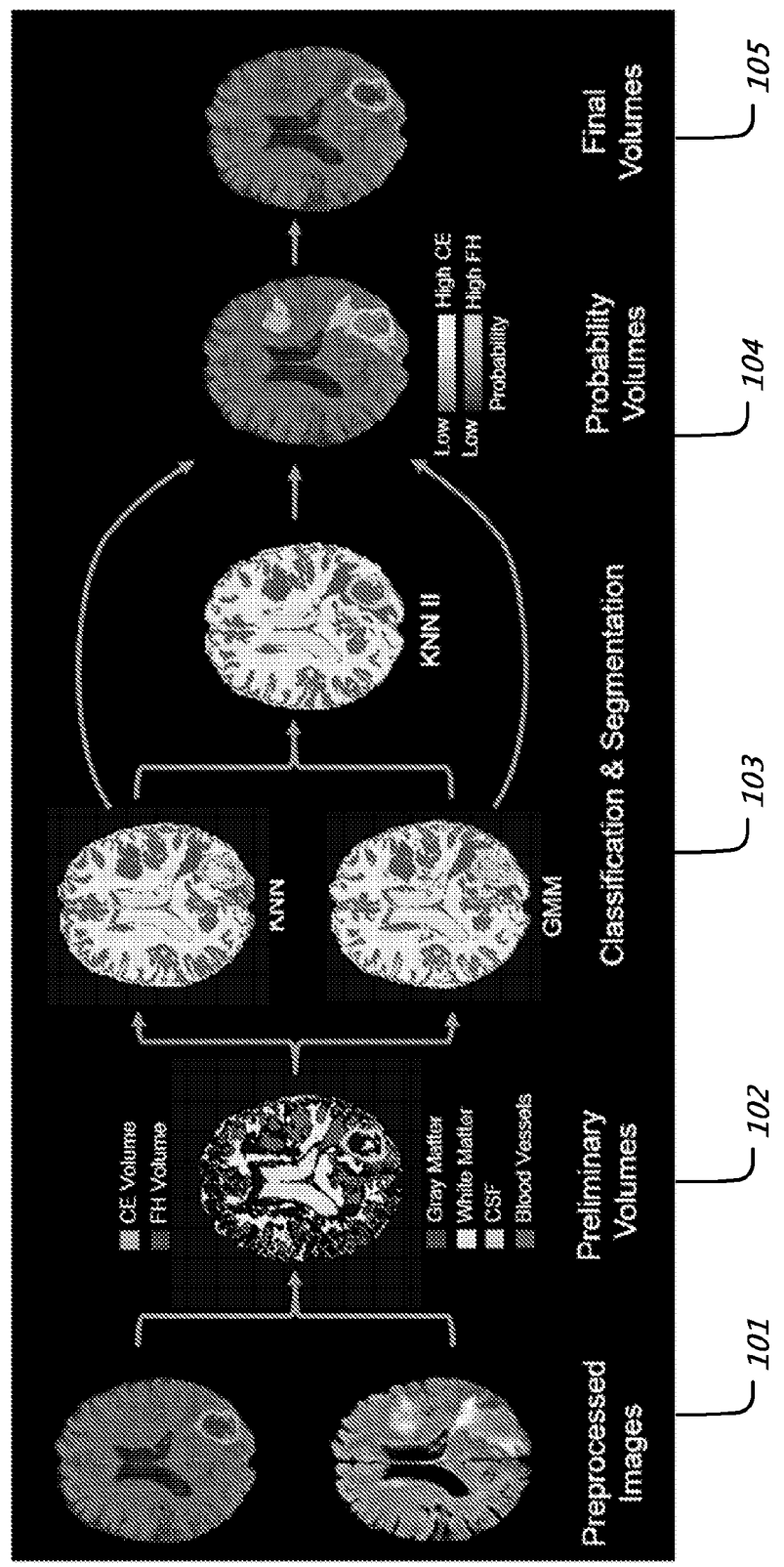
FIG. 1 shows an example of work flow of a method for segmentation of MRI images.

In the detailed description section, various embodiments have been described using section headings for improving readability of the text. The use of section headings has no relationship with the applicability or scope of the technology in any way.

Magnetic resonance imaging (MRI) is an imaging modality that uses non-ionizing radiation to create diagnostic useful images. An MRI scanner includes a large and very strong magnet in which the patient lies. A radio wave antenna is used to send signals to the body and then receive signals back. These returning signals are converted into MRI images by a computer attached to the scanner. Imaging of almost any part of a human body can be obtained in any plane. MRI image contrast is influenced by several characteristics of tissues and other materials including: T1, T2 and T2* relaxation as well as spin density, susceptibility effects and flow effects. A voxel represents a single sample, or data point, in an MRI image. Each voxel of an MRI image of the human body contains one or more tissues.

MRI images can be used for medical purposes for various diseases. Techniques disclosed in this document are described using Glioblastoma as an example. However, the technique is not limited to the application to Glioblastoma. Instead it may be applied to any suitable diseases. Glioblastoma is a common primary brain tumor and one of the deadliest human cancers. Over the past fifty years, improvement with regard to patient outcomes has been marginal. A major barrier in therapeutic development is attributable to the misconception that glioblastoma constitutes a single disease. However, molecular profiling of clinical specimens has revealed that glioblastoma is an umbrella term that encompasses multiple subtypes characterized by distinct molecular pathways. In order to improve the clinical outcome of patients afflicted by glioblastoma, technologies may be developed to define these subtypes.

MRI images may serve as a research and diagnostic tool for dissecting the features which define glioblastoma subtypes. Radiographic data is available for every patient because the clinical management of glioblastoma is largely driven by the interpretation of MRI images. Moreover, available MRI images suggest that the radiographic appearance of a glioblastoma is related to its physiologic state. To further study of the relationship, image archives with corresponding genomic profiling, like The Cancer Imaging Archive (TCIA) (http://cancerimagingarchive.net/), have been launched.

Much of the early works correlating MRI images of glioblastoma with genomic profiles were performed using manually-delineated tumor volumes or qualitative assessments provided by trained clinicians. These approaches are limited by the inherent variability of subjective interpretation, and significant inter-rater discrepancies have been reported. Additionally, manual segmentation can be time-consuming for large datasets. This limitation is particularly apparent when multiple radiographic features require segmentation. To address these deficiencies, efforts have been devoted to developing automated methods for segmenting tumor volumes. However, the success of these methods has been limited by the lack of standardized imaging methodologies between institutions and the significant overlap between the radiographic appearance of glioblastoma and normal anatomic structures on MRI images.

We hypothesized that a probabilistic approach by using subject-specific classifiers would reliably discriminate glioblastoma from the surrounding cerebrum. In this algorithm, termed iterative probabilistic voxel labeling (IPVL), sparse, high-specificity, preliminary volumes were created for each subject by using a combination of region growing and K-means-based tissue segmentation. Sampling of these preliminary volumes trained k-nearest neighbor (KNN) and Gaussian mixture model (GMM) classifiers by using voxel intensity and spatial coordinates. Voxel labels are assigned probabilistically by iteratively trained classifiers. Finally, each voxel is labeled as contrast enhancing tumor volume (CEV), FLAIR hyperintensity volume (FHV), gray matter, white matter, CSF, and blood vessel (BV). In one beneficial aspect, our algorithm reliably segments images from the TCIA that were acquired by a variety of scanners and protocols.

During experimentation, the Cancer Imaging Archive (TCIA) MRI images were acquired from a number of institutions whose scanners differed by manufacturer and model. The sequence, quality, and resolution of the images also varied, as listed in Table 1.

TABLE 1

Site, scanner, and image information for the TCIA subjects analyzed.

| | | | | T1wCE | | FLAIR | |
| --- | --- | --- | --- | --- | --- | --- | --- |
| Subject | Site | Scanner | Year | Resolution (mm$^2$) | Slice Thickness (mm) | Resolution (mm2) | Slice Thickness (mm) |
| TCGA-02-0033 | MD Anderson Cancer Center | GE Genesis Signa 1.5T | 1997 | 0.78 × 0.78 | 6.5 | 0.78 × 0.78 | 6.5 |
| TCGA-02-0048 | MD Anderson Cancer Center | GE Genesis Signa 1.5T | 1999 | 0.98 × 0.98 | 1.5 | 0.78 × 0.78 | 6.5 |
| TCGA-02-0064 | MD Anderson Cancer Center | GE Signa Excite 3T | 1999 | 0.47 × 0.47 | 6.5 | 0.94 × 0.94 | 2 |
| TCGA-02-0068 | MD Anderson Cancer Center | GE Signa Excite 1.5T | 2000 | 0.86 × 0.86 | 6.5 | 0.86 × 0.86 | 6.5 |
| TCGA-02-0075 | MD Anderson Cancer Center | GE Signa Excite 3T | 1999 | 0.86 × 0.86 | 1.5 | 0.86 × 0.86 | 6.5 |
| TCGA-06-0137 | Henry Ford Hospital | N/A | 2001 | 0.94 × 0.94 | 3 | 0.94 × 0.94 | 3 |
| TCGA-06-0139 | Henry Ford Hospital | N/A | 2004 | 0.47 × 0.47 | 2.5 | 0.47 × 0.47 | 2.5 |
| TCGA-06-0143 | Henry Ford Hospital | N/A | 2005 | 0.47 × 0.47 | 3 | 0.47 × 0.47 | 2.5 |
| TCGA-06-0154 | Henry Ford Hospital | N/A | 1996 | 0.94 × 0.94 | 3 | 0.94 × 0.94 | 3 |
| TCGA-06-0164 | Henry Ford Hospital | N/A | 1999 | 0.94 × 0.94 | 3 | 0.94 × 0.94 | 3 |
| TCGA-08-0358 | UCSF Med. Ctr. | GE Genesis Signa 1.5T | 2002 | 1.02 × 1.02 | 1.5 | 0.86 × 5 | 0.86 |
| TCGA-14-1794 | Emory Univ. | Philips Intera 1.5T | 1998 | 0.45 × 0.45 | 6 | 0.45 × 0.45 | 6 |
| TCGA-15-2714 | Mayo Clinic | GE Signa Excite 1.5T | 1996 | 0.86 × 0.86 | 4 | 0.86 × 0.86 | 4 |
| TCGA-76-5384 | Thomas Jefferson Univ. | Siemens Magnetom Vision 1.5T | 2000 | 0.86 × 0.86 | 7.5 | 0.86 × 0.86 | 7.5 |
| TCGA-76-6190 | Thomas Jefferson Univ. | Siemens Magnetom Vision 1.5T | 1998 | 0.47 × 0.47 | 1.5 | 0.86 × 0.86 | 7.5 |

MRI images of glioblastoma subjects from The Cancer Imaging Archive (TCIA) archive were used in the study. Subjects were identified with the following properties: (1) subject underwent MRI image prior to surgery and (2) subject had a full complement of images, including: T1-weighted image (T1w), T1-weighted image with contrast enhancement (T1wCE), T2-weighted (T2w), and Fluid-attenuated inversion recovery (FLAIR). Subjects were excluded when one or more modalities contained a prohibitive amount of motion or distortion artifact. The disclosed method was developed in a "pilot" set of subjects from the TCIA. The disclosed method was tested in an additional fifteen subjects selected from the TCIA which were not utilized during development. TCIA and MR images were acquired from a number of institutions whose scanners differed by manufacturer and model and whose images varied by sequence, quality, and spatial resolution.

Example Work Flow for Segmentation

FIG. 1 shows an example of work flow of a method for segmentation and quantitative parameterization of MRI images. The method may be called Iterative Probabilistic Voxel Labeling (IPVL). The method may comprise 5 stages: preprocessing, preliminary segmentation, classification, probability mapping, and final segmentation. At 101, TCIA images were downloaded and preprocessed to correct for field bias and remove non-brain elements. At 102, preliminary segmentation was performed to generate conservative yet highly specific preliminary volumes. At 103, these volumes generated in 102 were used to train classification methods, such as k-nearest neighbor (KNN) and Gaussian mixture model (GMM) probabilistic classifiers. The consensus of KNN and GMM classification was resampled and used to train a new classifier (KNN II), which assigns voxel tissue labels. At 104, the classifiers integrate their respective outputs to generate tissue specific probability volumes. At 105, the voxels were assigned based on their greatest probability of membership to a tissue label, and a voxel continuity filter was applied to eliminate clusters less than 150 continuous voxels.

Examples of Preprocessing

In preprocessing (101), images were loaded. Bias field correction, skull stripping, and registration to the MNI template were then performed. The results of preprocessing created images in standard space to provide input for preliminary segmentation. Preliminary segmentation assigns voxel labels to: contrast enhancing tumor volume (CE), Fluid-attenuated inversion recovery (FLAIR) hyperintensity volume (FH), gray matter (GM), white matter (WM), cerebral spinal fluid (CSF), and blood vessels (BV), and unassigned (for voxels with ambiguous membership) using k-means-based tissue segmentation and a region growing algorithm. During classification, voxels sampled from the preliminary volumes were used to train the GMM and KNN classifiers. The voxels were then classified to identify CE, FH, BV, CSF, GM, and WM volumes. During probability mapping, each voxel is assigned a probability of membership to each tissue label. In the last step, final segmentation, voxels are labeled according to their greatest probability, and a voxel continuity filter is applied to eliminate clusters less than 150 continuous voxels. The average duration of segmentation was completed in an average of 11.12±5.63 mins. More details of each operation are described below.

Preprocessing—the objective is to remove image distortions caused by gradient nonlinearity warping, bias-field correction, removed regions outside of the brain. In brain image analysis, registration allows information from multiple sources to be combined in a common frame of reference, in order to aid clinical interpretation. Image registration involves the deformation or transformation of images such that corresponding features are brought into spatial alignment.

Images were preprocessed using a combination of in-house software and external software including the FMRIB Software Library (FSL 5.0, http://fsl.fmrib.ox.ac.uk/fsl). Image distortions caused by gradient nonlinearity warping were corrected using in-house software, followed by bias-field correction using FMRIB's Automated Segmentation Tool (FAST) and registered to the MNI152 nonlinear $6^{th}$ generation standard brain image. This registration was performed using FSL's linear registration tool (FLIRT) by an affine transformation. In order to ensure that the preprocessing removed regions outside of the brain (e.g. skull, optic nerve, and carotid arteries), a stringent brain mask was created from the T1W1 weighted images using a combination of FSL's Brain Extraction Tool[33] (BET) and the Robust Brain Extraction Tool (ROBEX, https://www.nitrc.org/projects/robex). In some embodiments, the described method automatically compares the resultant brain with the volume derived from applying Montreal Neurological Institute brain mask. Overestimation of greater than 10%, or another threshold, would be used to adjust fractional intensity, resulting in more restrictive brain outlines.

Preliminary Segmentation

In order to appropriately train the disclosed segmentation algorithm to recognize each subject's tumor features, it was crucial to generate highly specific volumes that accurately represented the range of intensity and spatial data for each tissue feature label. After skull stripping, initial tissue segmentation into preliminary WM, GM, CSF, and CE volumes was performed for the available T1w imaging sequences using FAST. The FAST-derived CE volume consisted of both tumor-associated CE volume and blood vessel (BV) volumes. The preliminary BV volume was distinguished from the FAST-derived CE volume by performing two morphology-based manipulations. First, CE objects located near the cortical surface were selectively removed using a uniform spherical 3 mm erosion of the brain mask applied to the FAST-derived CE volumes. Large vessels, such as the dural veins and carotid arteries, were removed by this operation due to their proximity to the brain surface. Second, a modified region growing algorithm was employed to identify vessels which were continuous with the venous sinuses. This algorithm was seeded in the region of the torcula (confluence of the sinuses). This seed location was identified on the template image to which all images were registered. After seeding, the region growing algorithm identified voxels of comparable intensity in contact with the seed region while respecting regions of large intensity change as boundaries. Voxels identified as vessels by the combination of these methods were identified as preliminary BV volume, while the remaining CE volumes were assigned to tumor-associated CE volume.

The FLAIR preliminary volume was created first by determining an automatic threshold for the FLAIR image using Otsu's method. This method automatically reduces a gray level image to a binary image by calculating the optimal cutoff separating two classes of intensities. FLAIR hyper-intense (FH) regions on MR may be tumor-associated or non-tumor associated (e.g. periventricular or pericortical). The non-tumor associated FH elements were excluded using a spherical 3 mm erosion performed on the brain mask while a spherical 3 mm dilation was performed on the CSF volume. Together, these operations removed pericortical FH as well as the periventricular FH from the remainder of the preliminary FH volume.

In these ways, the CE, FH, CSF, GM, WM, and BV preliminary volumes were identified and labeled. The voxels assigned to the preliminary volumes were used as the basis for training probabilistic classifiers (KNN and GMM). Voxels that were not classified into these categories during preliminary volume segmentation remained unassigned to avoid adding noise to the classifiers.

Approximately 25% of voxels were labeled at this time. The voxels labeled were randomly sampled from regions that had the highest specificity to a particular volume of interest. For contrast enhancement, these included regions of contrast enhancement not continuous with the sagittal and transverse sinus. For FLAIR hyperintensity, these included regions above an intensity threshold>1.5 SDs above the mean intensity of the FLAIR image. The voxels assigned to each preliminary tissue label were used as the basis for training probabilistic classifiers (KNN and GMM). Voxels that were not classified into these categories during preliminary volume segmentation remained unassigned to avoid adding noise to the classifiers.

K-Nearest Neighbor and Gaussian Mixture Model Classifiers

Classification methods, such as k-nearest neighbor (KNN) and Gaussian mixture model (GMM) classifiers are employed on the preliminary segmented MRI images. KNN and GNM classifiers were used to assign voxel membership. The KNN algorithm is a non-parametric method which assigns membership of a single datum based on a number of neighboring training examples. GMM allows for statistical clustering of data into a predefined number of Gaussian distributions which, in this case, represent distinct imaging features. Use of these two probabilistic classifiers was complementary.

To expedite processing and improve accuracy, a weighted random sampling of the preliminary volume voxels was employed to train both KNN and GMM classifiers. The weights for sampling reflected the relative distribution of voxels assigned to tissue labels from preliminary segmentation. Weighting was performed to avoid biasing the classifiers toward any particular tissue label caused by overrepresentation attributed to sampling error. Training was performed on a subject-by-subject basis, e.g., each patient was segmented according to his or her subject-specific classifier by using both intensity and spatial data from each voxel to define labels. For example, in some embodiments, each voxel's MNI (Montreal Neurological Institute) spatial coordinates and intensity value in each image constituted the parameters which were used to train the GMM and KNN classifiers.

Training was performed on a subject-by-subject basis, meaning that each patient was segmented according to his or her own subject-specific classifier by using both intensity and spatial data from each voxel to define labels. After training, all voxels, including those which were unassigned during preliminary volume creation, were classified by both KNN and GMM probabilistically to the six tissue labels: CE, FH, CSF, GM, WM, and BV.

The algorithm assigned the probability of membership for each voxel to six tissue labels by a distance metric determined during classifier training. For each voxel, the greatest tissue label probability determined voxel labeling, and the consensus of the classifiers was determined. Classifier consensus was resampled and used to retrain another iteration of KNN classification at a higher sampling rate. This step had the benefit of reducing noise introduced during the creation of preliminary volumes, improving both the smoothness of the final volumes and accuracy of the tissue labels.

Final Segmentation

At segmentation step, voxel label probabilities from all classifiers were summed for each tissue label, and a final segmentation volume was created by assigning voxels according to the highest probability membership to each tissue label. A voxel continuity filter was applied which removed discontinuous voxels of limited connectivity of fewer than 150 contiguous voxels. To address voxels which had equal probabilities of belonging to two or more tissue labels, priority was set in the following manner from greatest to least: CE>FH>BV in order to ensure that individual voxel tissue labels were mutually exclusive. This order was determined by our confidence in the quality of voxel assignment pertaining to CE, FH, and BV.

Segmentation Evaluation

To assess segmentation quality, CE and FH volumes were drawn manually for 15 subjects selected randomly from the available pool of subjects downloaded from the TCIA. These volumes were completed by two independent trained operators under the supervision of a neuroradiologist (NF) and a neurosurgeon (CCC). The manual delineation of tumor-associated volumes was performed using the software program AMIRA (http://www.vsg3d.com/amira/overview). Operators drew volumes using threshold-assisted segmentation on whole brain images registered to the MNI template. Operator-derived volumes were compared to automated volumes using the Dice Coefficient (DICE) which assesses the similarity between two volumes by dividing twice the sum of the intersection by the sum of both volumes. Inter-operator similarity was also determined by this metric. A DICE which is equal to 1 would imply perfect similarity and overlap of two volumes.

Minimum Image Requirement for Adequate Segmentation

To assess the performance of our method when fewer imaging sequences were available for input, we employed our algorithm on the same group of 15 subjects multiple times while removing one or more images to recapitulate the most common image combinations seen within the TCIA subjects. The minimum image requirement was limited to a single image (T1wCE). The segmentations which resulted from these image combinations were compared to operator volumes in order to determine their DICE similarities. FH volumes were not segmented in image combinations lacking FLAIR.

Results

Manual Segmentation Comparison

Figure 2:
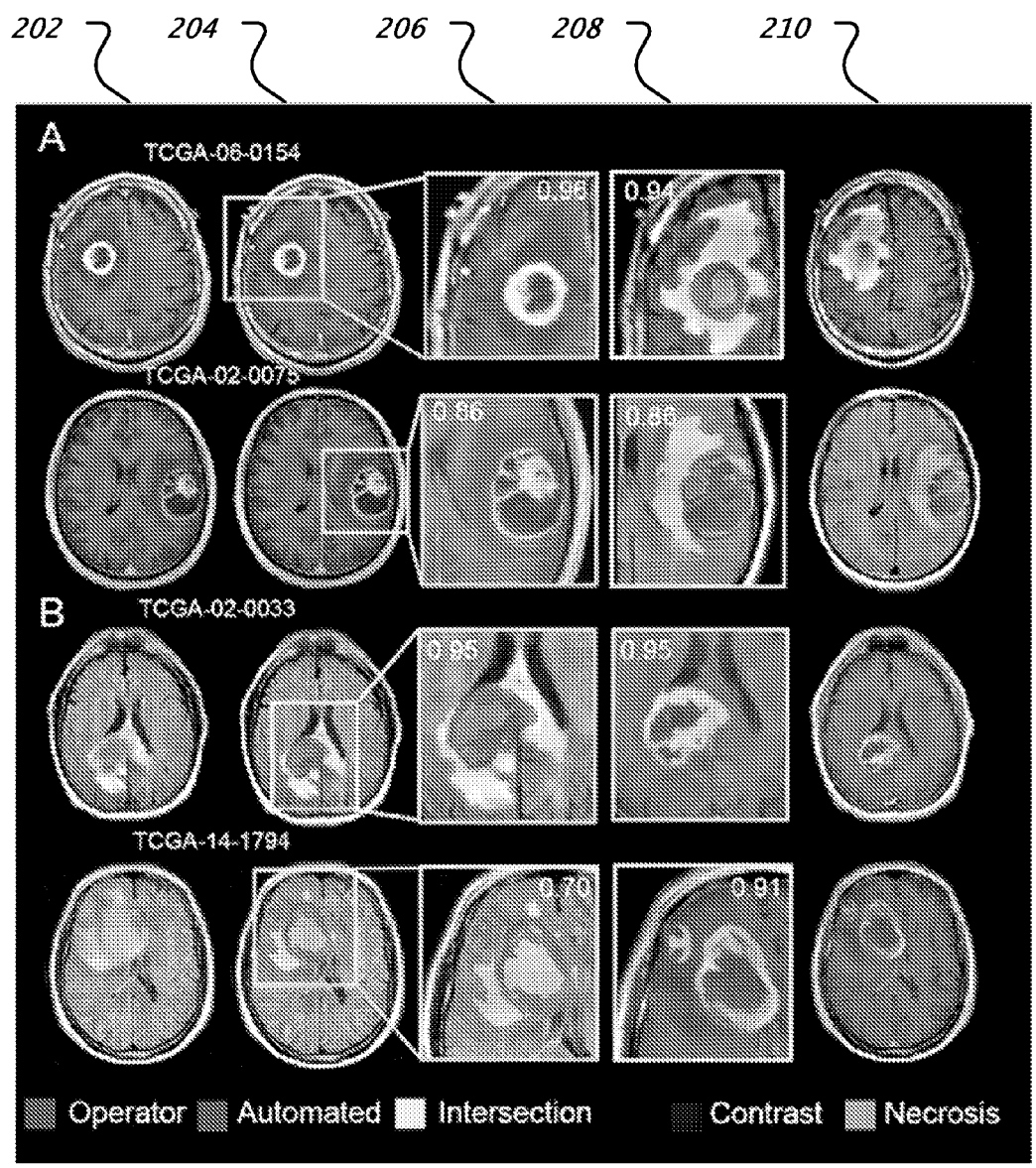
FIG. 2 shows an example of comparison of results obtained by the disclosed method and results obtained by human operators.

FIG. 2 shows an example comparison of results obtained by the disclosed method and results obtained by human operators. IPVL segments volumes that are highly analogous to operator-defined volumes. Results from four subjects representing the highest and lowest Dice coefficient (DICE) scores with respect to operator 1 for CE volumes and FH volumes are shown. (A) The highest DICE (top) and lowest DICE (bottom) examples of IPVL-segmented CE volumes relative to operator-defined volumes are shown. The corresponding FH segmentation results are shown (right) to demonstrate that CE segmentation is independent of FH segmentation. (B) The highest DICE (top) and lowest DICE (bottom) examples of IPVL-segmented FH segmentations relative to operator-defined volumes are shown (202). The corresponding CE segmentations results are shown as well (204) to demonstrate that FH segmentation is independent of CE segmentation. Column 206 shows regions of intersections between operator and IPVL-defined volume. Column 208 shows operator-defined volume only. Column 210 shows IPVL-defined volume only. DICE scores were calculated as previously described.

Figure 3A:
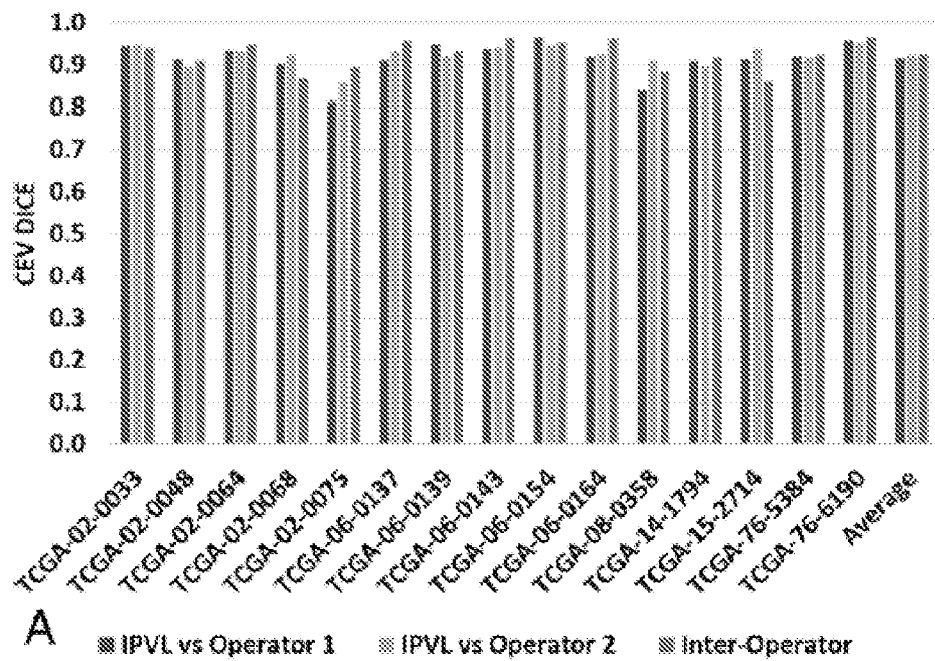
FIGS. 3A, 3B, 3C and 3D show example of quantitative comparisons of results obtained by the disclosed method and results obtained by human operators.
Figure 3B:
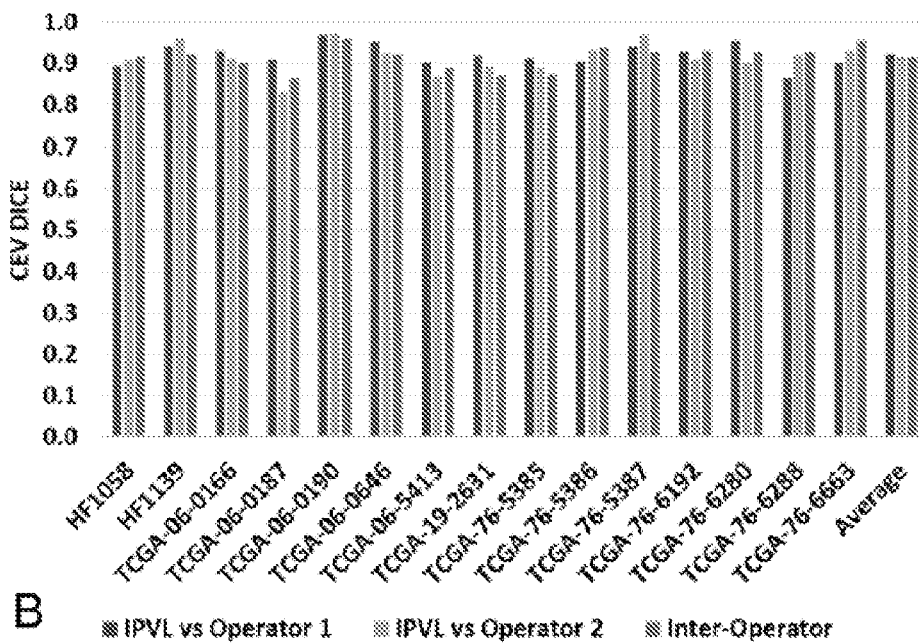

FIGS. 3A and 3B show examples of quantitative comparisons of results obtained by the disclosed method and results obtained by human operators. Quantitative comparison between IPVL-defined volumes and operator-derived volumes compared relative to inter-operator comparisons. (A) Dice coefficient (DICE) comparisons for IPVL-defined and operator-defined CE volumes. DICE scores were calculated as previously described comparing CE volumes generated by IPVL, operator 1, and operator 2. (B) DICE score comparisons for IPVL-defined and operator-defined FH volumes. DICE were calculated comparing FH volumes generated by IPVL, operator 1, and operator 2.

Figure 3C:
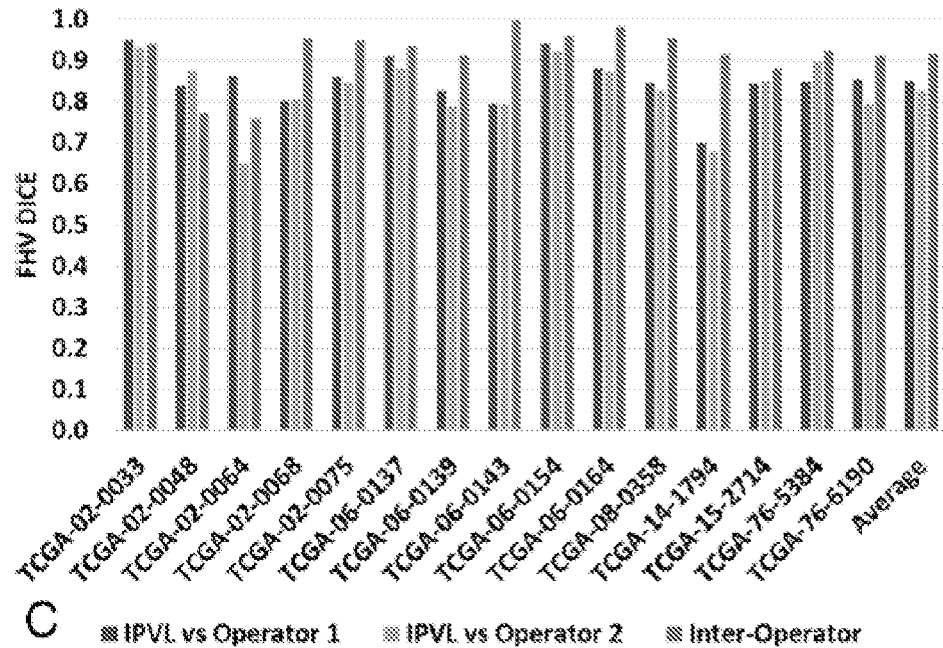
Figure 3D:
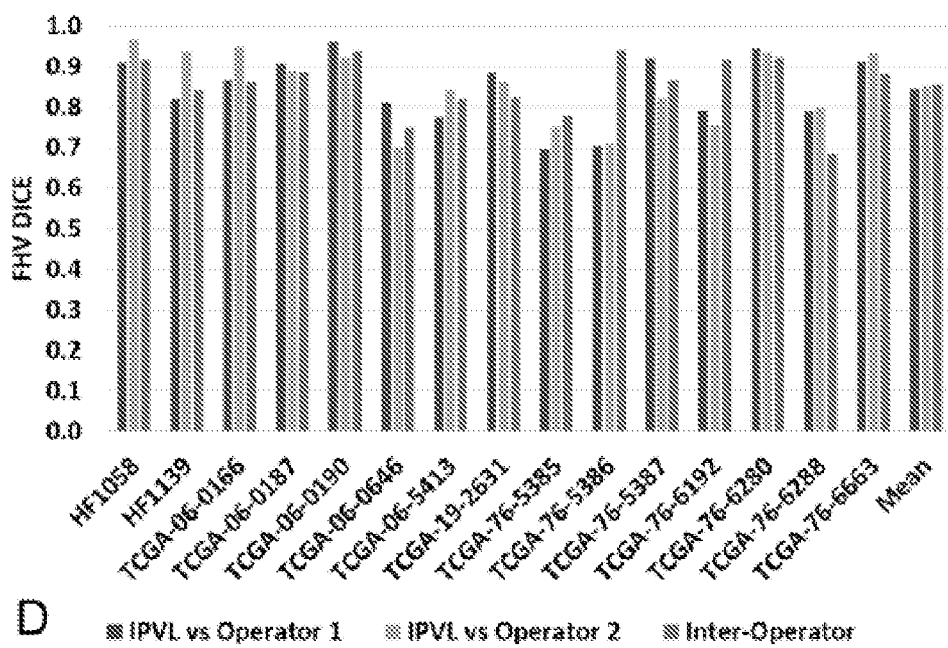

FIGS. 3C and 3D show examples of quantitative comparisons of results obtained by the disclosed method and results obtained by human operators. Quantitative comparison between IPVL-defined volumes and operator-derived volumes compared relative to inter-operator comparisons. FIG. 3C and FIG. 3D respectively show DICE score comparisons for IPVL defined and operator defined FH volumes.

DICE scores were calculated by comparing FH volumes generated by IPVL, operator 1 and operator 2.

Examples from four subjects which represented the CE and FH volumes with the highest and lowest DICE scores relative to operator 1 are shown in FIG. 2. Corresponding FH segmentations for CE and CE segmentations for FH are included to show that segmentation success for one feature is not necessarily correlated with segmentation success for corresponding features. Analysis showed no statistical difference between operator-derived volumes so operator 1 was selected as the basis for image comparison (p=0.72 for CE, and p=0.10 for FH).

FIG. 2 demonstrates that the algorithm generates highly analogous CE and FH volumes relative to those derived manually. IPVL CE volumes were statistically indistinguishable from volumes generated by expert operators across all subjects (p=0.93). DICE scores, for automated CE volumes, relative to operator 1 and operator 2 averaged 0.923 and 0.921, respectively. These DICE scores were highly comparable to those obtained from inter-operator analysis (average of 0.923, FIG. 3A).

For automated FH volumes, the DICE scores relative to operator 1 and operator 2 averaged 0.851 and 0.815 respectively. DICE scores obtained from inter-operator analysis averaged 0.905 (FIG. 3B). Analysis revealed that FH volumes were slightly lower than inter-operator comparison (p=0.04). We observed that FH DICE scores were poorer than CE DICE scores for both the inter-operator and the operator-algorithm comparisons. Overall, the DICE scores for both CE and FLAIR achieved through our algorithm were improved or similar relative to those previously reported.

Minimal Image Requirement for Adequate Segmentation

The TCIA and other image databases include many subjects who do not have the full complement of T1-weighted (T1), T1-weighted with contrast enhancement (T1wCE), T2-weighted (T2w), and FLAIR images. In fact, this full set of imaging was available in only 51.97% of the TCIA subjects. Therefore, it was of interest to determine how our algorithm would perform when limited imaging modalities were available. To this end, we determined how the sequential removal of the various image sequences impacted segmentation performance relative to the full complement of imaging. DICE scores were determined for each subject using each combination of images relative to operator 1-defined volumes. These DICE scores were plotted for all subjects compared to the DICE scores derived from segmentations using all 4 imaging sequences. Similar results were attained when operator 2 volumes were used as the basis for comparison (Supplemental Figure).

FIGS. 4A, 4B, 4C, 4D and 4E show examples of effects of the choice of the sample set for the segmentation. (FIG. 4A) Select image sequences (such as T1w) were removed prior to IPVL CE segmentation. The image sequence(s) available for IPVL was indicated as +. DICE score was calculated for the resultant CE segmentation relative to operator 1-defined CE volume. The distribution of DICE across all subjects as a result of image sequence removal was shown as a box-plot. (FIG. 4B) Select image sequences were removed prior to IPVL FH segmentation. The image sequence(s) available for IPVL was indicated as +. DICE was calculated for the resultant FH segmentation relative to operator 1 defined FH. The distribution of DICE across all subjects as a result of image sequence removal was shown as a box-plot. (FIG. 4C) Box plot demonstrating the range DICE score for IPVL segmented CE volume relative to operator-defined CE volume per patient for all image combinations tested. (FIG. 4D) Box plot demonstrating the range DICE score for IPVL segmented FH relative to operator-defined FH per patient for all image combinations tested. (FIG. 4E) Box plot demonstrating the range DICE score for IPVL segmented CE volume relative to operator-defined CE volume per patient when only T1w and FLAIR source images were used for IPVL segmentation.

Figures 4A, 4B:
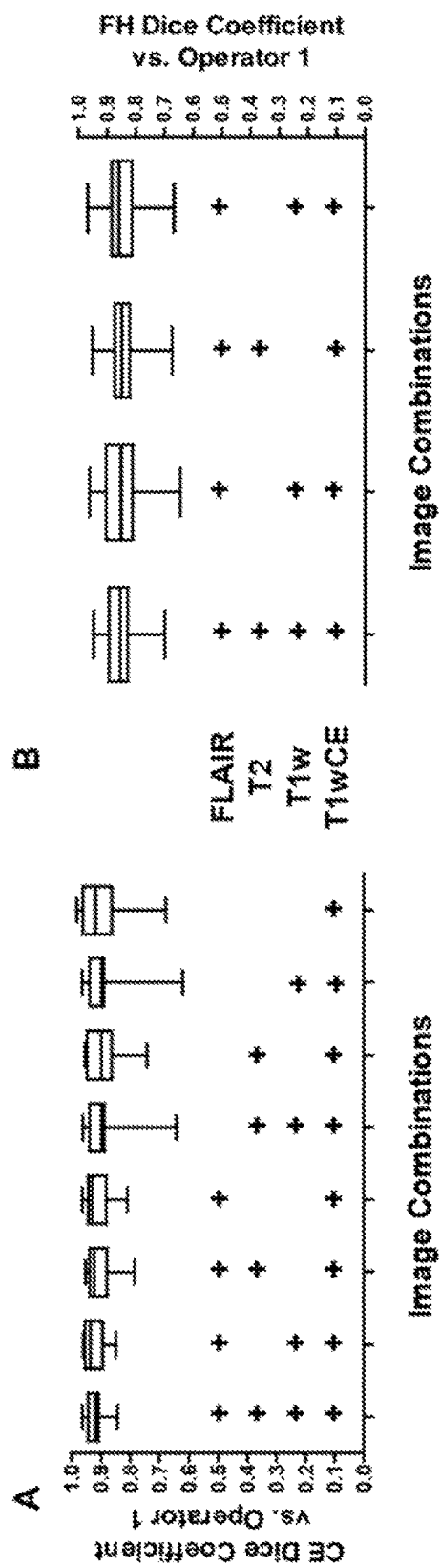

For CE volume segmentation, removal of T1w and T2 images did not significantly affect performance. The DICE scores obtained when comparing volumes delineated using only T1wCE and FLAIR were comparable to those obtained when all 4 imaging sequences were processed by our algorithm (FIG. 4A). Similarly, FH volume segmentation was minimally impacted by image reduction, and DICE scores using all 4 imaging sequences were comparable to those obtained when using only T1wCE and FLAIR (FIG. 4B).

To further characterize the impact of reducing the number of image sequences on the performance of CE and FH segmentation, we plotted the range of DICE scores that resulted from removing one or more image series for each subject. For most subjects, removing images minimally impacted DICE scores, meaning that the quality of volume segmentation was not significantly altered (FIG. 4C for CE, FIG. 4D for FH). For FH segmentation, removal of T2w and T1w images did not significantly affect DICE scores relative to Operator 1 (FIG. 4D for FH).

Only two subjects, TCGA-02-0068 and TCGA-06-0164, had increased vessel contamination of the CE volume when FLAIR images were removed during image reduction analysis. CE segmentation for image combinations which contained at least a FLAIR and T1wCE image were highly comparable across all subjects (FIG. 4E). While adequate CE segmentation required only T1wCE for the majority of cases, FLAIR images improved CE and BV discrimination and may be required for segmentation in a subset of subjects. Surprisingly, CE segmentation for T1wCE and FLAIR alone was nearly identical to CE segmentation results which utilized all available imaging series. These results suggest that our algorithm requires only T1wCE and FLAIR images for robust volume segmentation of both tumor-associated CE and FH volume, and that additional imaging series do not contribute significantly to the segmentation results.

To ensure that these results were generalizable, we randomly selected 15 additional subjects for analysis. The results from this analysis are highly comparable with those reported above. DICE scores for automated CEVs relative to operators 1 and 2 averaged 0.921 and 0.901, respectively. These DICE scores were highly comparable with those obtained from interoperator analysis (DICE=0.905). For automated FHVs, the DICE scores relative to operators 1 and 2 averaged 0.846 and 0.823, respectively. DICE scores obtained from interoperator analysis averaged 0.812.

It was possible that difficult cases, including tumors with multifocal patterns, or tumors with attachment to large vessels or the brain surface, may cause errors in automatic segmentation. Of the images analyzed, 2 glioblastomas (The Cancer Genome Atlas [TCGA]-06-0139, TCGA-06-0166) were multifocal. For these subjects, IPVL-defined CEV and FHV showed mean DICE scores of 0.94 (range, 0.92-0.95) and 0.92 (range, 0.91-0.93) relative to expert defined volumes, respectively. Seven tumors (TCGA-02-0048, TCGA-06-0164, TCGA-08-0358, TCGA-76-6280, TCGA-76-6192, TCGA-76-5386, and HF1139) were located on the surface of the cerebrum. For these tumors, IPVL-defined CEV and FHV showed mean DICE scores of 0.92 (range, 0.84-0.96) and 0.84 (range, 0.70-0.95). One tumor (TCGA- 76-5385) was attached to a major vessel (the MCA). For this tumor, IPVL-defined CEV and FHV showed mean DICE scores of 0.90 (range, 0.89-0.91) and 0.72 (range, 0.70-0.75). These results suggest that our algorithm performs adequately in anatomic locations and in difficult cases that are historically challenging to previously published algorithms.

Discussion

Success of any automated segmentation process hinges on the a priori definition of the features that constitute a volume of interest. Human vision can integrate visual data along with both experience and assumption to distinguish and classify independent features. This task is often challenging for a computer, because the cross-section of data available to the computer is often simplified. We hypothesized that the complexity of image segmentation can be largely recapitulated by employing iterating probabilistic classifiers trained on sparse subject specific preliminary features. To test this hypothesis, we predefined the voxels that were most likely associated with the features of interest (e.g. CE) to generate preliminary volumes. We then used KNN and GMM probabilistic classifiers to refine the segmentation process. The KNN algorithm is a non-parametric method used to assign membership of a single voxel based on a number (k) of neighboring voxels and is particularly useful in defining local differences. GMM-assigned membership of each voxel is based on a Gaussian distribution and is particularly useful in voxel assignment which is more sensitive to global patterns. In our algorithm, these complementary probabilistic classifiers were integrated in an iterative manner to refine segmentation of the various features of an MR image. Our results demonstrate that resultant image segmentation is highly comparable to those manually delineated by trained clinicians and radiology experts.

Importantly, the time required for segmentation per subject averaged 11.2 minutes when all 4 image sequences were utilized. In contrast, manual segmentation by experts required 1 to 3 hours depending on the size and complexity of the volume to be segmented. As such, our method presents an opportunity for high-throughput quantitative analysis of TCIA images and other image databases. The insensitivity of our algorithm to inter-institutional methodological differences in MR imaging supports its utility for this application. Further supporting the utility of our algorithm, we demonstrated that only two image sequences (the T1wCE and FLAIR images) are needed for reliable segmentation of tumor CE and FH volumes.

While the disclosed study was focused on development of an algorithm for research use in terms of radiographic biomarker discovery, reliable volume segmentation using our algorithm may also impact clinical practice. For example, it is often difficult to detect subtle differences in radiographic appearance of a tumor during disease progression. As a result, it is not infrequent that changes in serial MR imaging are under-appreciated until the patient becomes symptomatic. Automated segmentation and quantitative comparisons between segmented images in this setting may help facilitate the detection of subtle radiographic changes, such as tumor progression, thereby allowing clinicians to perform therapeutic procedures to prevent clinical deterioration in select patients. Application of these methods may also aid the evaluation of therapeutic response in clinical trials.

Careful study of the discrepancies between the volumes generated by IPVL and expert defined volumes revealed a few limitations. The algorithm can fail to detect tumor CE or FH when regions of these volumes fall below the volume of a single voxel (~1 mm). This limitation, a result of voxel sampling and partial volume effect, could be mitigated through the use of higher resolution imaging. In a few subjects (TCGA-02-0068, TCGA-06-0154) reliable delineation of BV volume from tumor CE volume remained challenging when image combinations lacking FLAIR images were used for segmentation, leading us to conclude that FLAIR and T1wCE are required for our method. Quantitative assessment of FLAIR volumes remains a challenge, but this challenge is shared by the human eye—even for the most experience radiology expert. The use of higher order image processing, such as textural analysis may facilitate the improvement of our algorithm in the near future.

The above disclosed technique can be used to provide iterative probabilistic voxel mapping which is a reliable and robust tool for processing MR images in the TCIA dataset. Application of this method can facilitate quantitative radiographic assessment of glioblastoma in both the research setting and in clinical practice.

Figure 5:
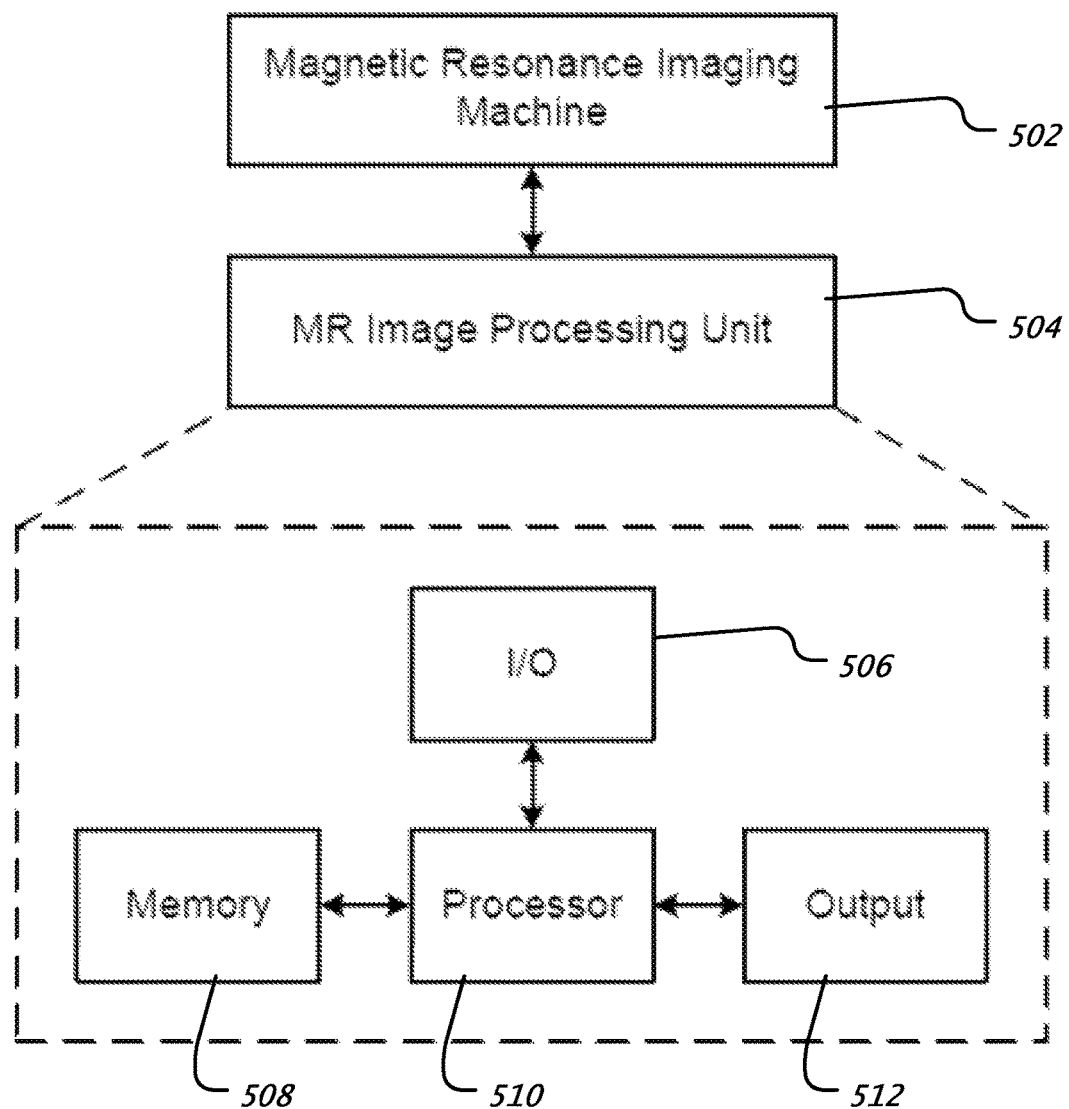
FIG. 5 shows an example of MRI-based system of the disclosed technology.

FIG. 5 shows an example of MRI-based system for implementing the disclosed techniques. This system includes an MRI machine 502, which can be controlled by an MRI processing unit 504.

The MRI machine 502 can be used in the system to implement the disclosed process under the control of the example of MR image processing unit. The MRI machine 502 can include various types of MRI systems, which can perform at least one of a multitude of MRI scans that can include, but are not limited to, functional MRI (fMRI) and related techniques such as arterial spin labeling (ASL), T1-weighted MRI scans, T2-weighted MRI scans, T2*-weighted MRI scans, spin density weighted MRI scans, diffusion tensor (DT) and diffusion weighted imaging (DWI) MRI scans, diffusion spectrum imaging (DSI) MRI scans, T1ρ MRI scans, magnetization transfer (MT) MRI scans, and real-time MRI, among other MRI techniques.

The MRI processing unit 504 can include a processor 510 that can be in communication with an input/output (I/O) unit 506, an output unit 512, and a memory unit 508. MRI processing unit 504 can be implemented as one of various data processing systems, such as a personal computer (PC), laptop, tablet, and mobile communication device. To support various functions of MRI processing unit 504, the processor 510 can be included to interface with and control operations of other components of MRI processing unit 504, such as the example I/O unit 506, the example output unit 512, and the example memory unit 508.

To support various functions of the MRI processing unit 504, the memory unit 508 can store other information and data, such as instructions, software, values, images, and other data processed or referenced by the processor. Various types of Random Access Memory (RAM) devices, Read Only Memory (ROM) devices, Flash Memory devices, and other suitable storage media can be used to implement storage functions of the memory unit. The memory unit can store MRI data and information, which can include subject MRI image data including spatial and spectral data, MRI machine system parameters, data processing parameters, and processed parameters and data that can be used in the implementation of an RSI characterization. The memory unit can store data and information that can be used to implement an MRI-based RSI process and that can be generated from an MRI-based RSI characterization algorithm and model.

To support various functions of the MRI processing unit, the I/O unit can be connected to an external interface, source of data storage, or display device. Various types of wired or wireless interfaces compatible with typical data communication standards, such as Universal Serial Bus (USB), IEEE 1394 (FireWire), Bluetooth, IEEE 802.111, Wireless Local Area Network (WLAN), Wireless Personal Area Network (WPAN), Wireless Wide Area Network (WWAN), WiMAX, IEEE 802.16 (Worldwide Interoperability for Microwave Access (WiMAX)), and parallel interfaces, can be used to implement the I/O unit. The I/O unit can interface with an external interface, source of data storage, or display device to retrieve and transfer data and information that can be processed by the processor, stored in the memory unit, or exhibited on the output unit.

To support various functions of the MR image processing unit, the output unit can be used to exhibit data implemented by the example MR image processing unit. The output unit can include various types of display, speaker, or printing interfaces to implement the example output unit. For example, the output unit can include cathode ray tube (CRT), light emitting diode (LED), or liquid crystal display (LCD) monitor or screen as a visual display to implement the output unit. In other examples, the output unit can include toner, liquid inkjet, solid ink, dye sublimation, inkless (such as thermal or UV) printing apparatuses to implement the output unit; the output unit can include various types of audio signal transducer apparatuses to implement the output unit. The output unit can exhibit data and information, such as patient diagnostic data, MRI machine system information, partially processed MRI-based RSI processing information, and completely processed MRI-based RSI processing information. The output unit can store data and information used to implement an example of MRI-based RSI characterization process and from an implemented MRI-based RSI characterization process.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

Figure 6:
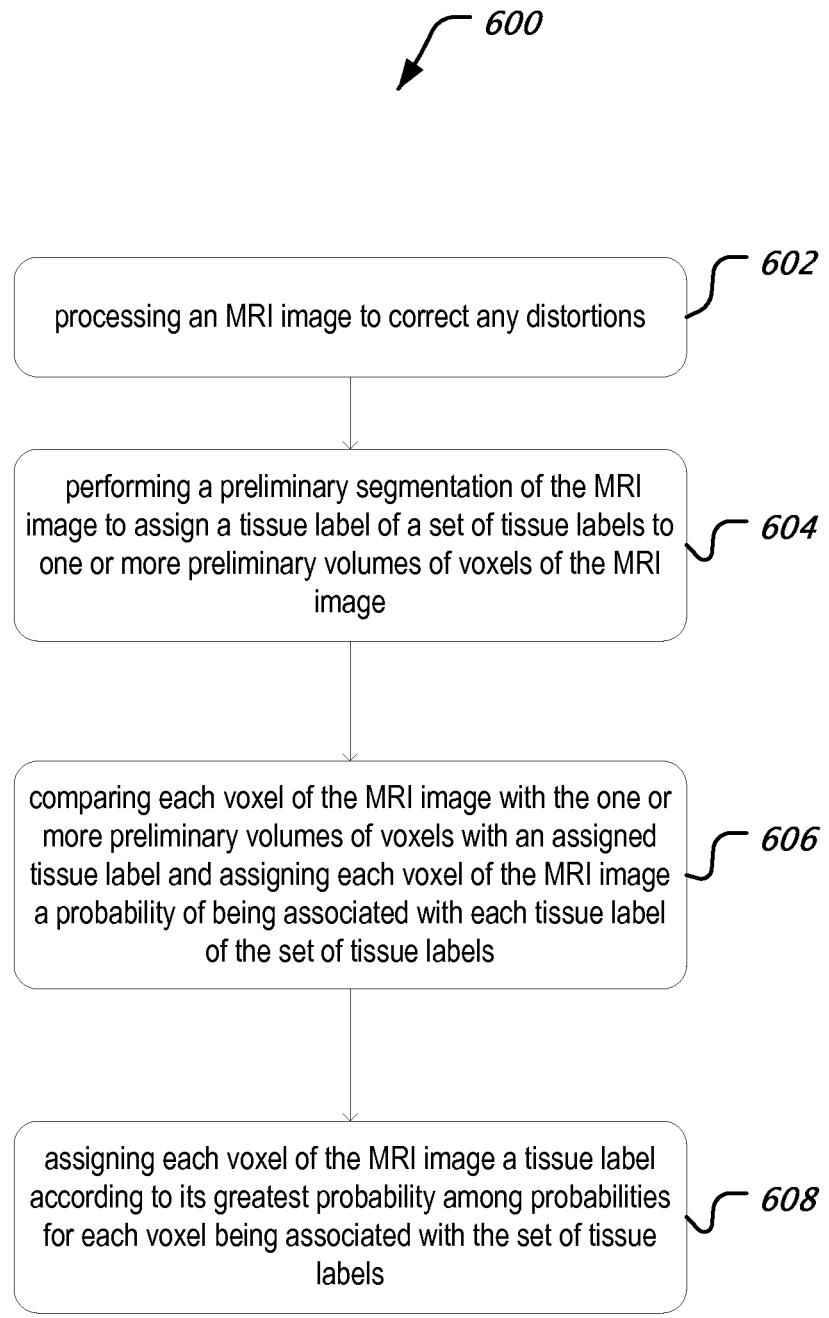
FIG. 6 shows an example of flow chart of a method for segmentation of MRI images.

FIG. 6 shows an example flow chart of a method 600 for segmentation of MRI images. At 602, the method 600 processes an MRI image to correct any distortions on the image caused by various reasons. At 604, the method 600 performs a preliminary segmentation of the MRI image to assign a tissue label of a set of tissue labels to one or more preliminary volumes of voxels of the MRI image. At 606, the method 600 compares each voxel of the MRI image with the one or more preliminary volumes of voxels with an assigned tissue label, and assigns each voxel of the MRI image a probability of being associated with each tissue label of the set of tissue labels. At 608, the method 600 assigns each voxel of the MRI image a tissue label according to its greatest probability among probabilities for each voxel being associated with the set of tissue labels.

In some embodiments, the comparing 606 and assigning 608 may include training a classifier using the voxels of the one or more preliminary volumes with the assigned tissue label, and assigning by the classifier each voxel of the MRI image a probability of membership for each tissue label. In some embodiments, the method 600 may further include filtering the MRI image to remove any clusters of voxels that have fewer than a certain number of continuous voxels. In some embodiments, the set of tissue labels includes: contrast enhancing (CE), fluid-attenuated inversion recovery hyperintensity (FH), gray matter (GM), white matter (WM), cerebral spinal fluid (CSF), and blood vessel (BV).

In some embodiments, the operation 602 may further include the processing the MRI image to correct any distortions includes skull stripping and registration to Montreal Neurological Institute (MNI) templates. In some embodiments, the classifier comprises a k-nearest neighbor (KNN) probabilistic classifier and a Gaussian mixture model (GMM) probabilistic classifier.

In some embodiments, the preliminary volumes, or volume elements, may be derived based on classifications performed by trained human operators. The comparison between voxels of a preprocessed image and such volumes may be performed by calculating a ratio between volume of the voxel and volumes of the preliminary volume elements.

Figure 7:
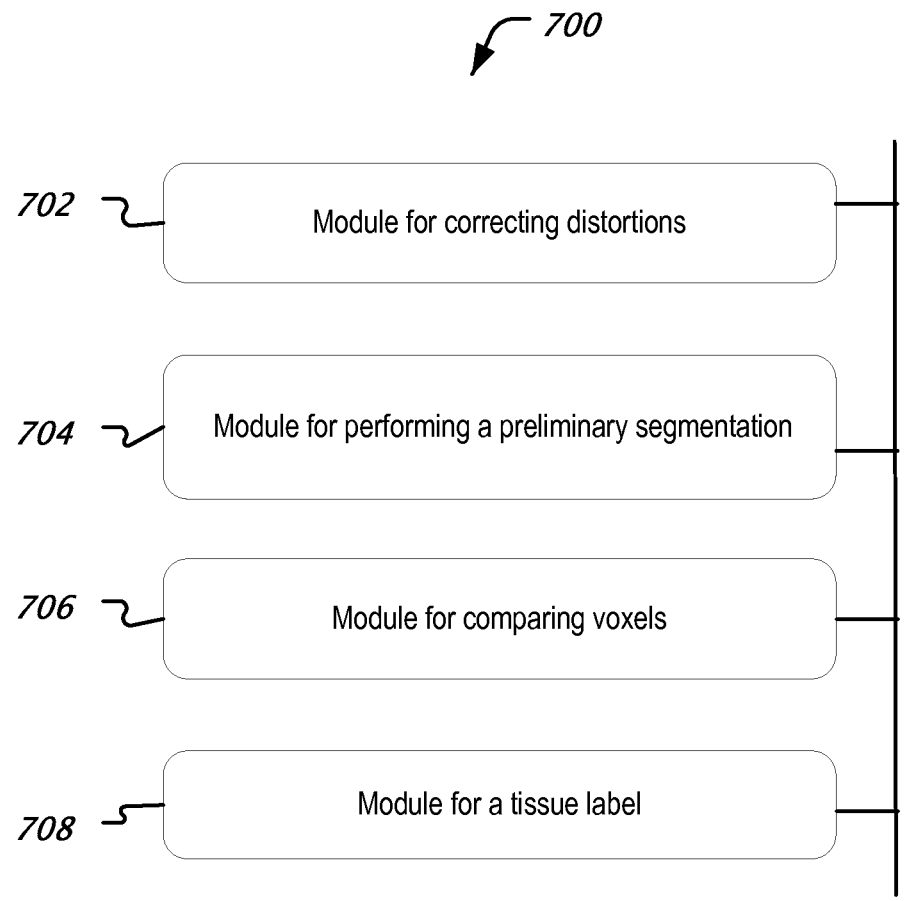
FIG. 7 is a block diagram illustrating an example of an apparatus for segmenting MRI images by processing voxels that form the images.

FIG. 7 is a block diagram illustrating an example of an apparatus 700 for segmenting MRI images by processing voxels that form the images. The module 702 is for correcting distortions in the MRI image. As described herein, The module 704 is for performing a preliminary segmentation of the MRI image to assign a tissue label of a set of tissue labels to one or more preliminary volumes of voxels of the MRI image. The module 706 is for comparing each voxel of the MRI image with the one or more preliminary volumes of voxels with an assigned tissue label and assigning each voxel of the MRI image a probability of being associated with each tissue label of the set of tissue labels. The module 708 is for assigning each voxel of the MRI image a tissue label according to its greatest probability among probabilities for each voxel being associated with the set of tissue labels. The various functions and operations described herein may be implemented using modules that may be implemented in software, hardware or a combination of software and hardware.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed are techniques and structures as described and shown, including:

1. A method for processing a magnetic resonance imaging (MRI) image, comprising:
preprocessing the MRI image to correct distortions;
performing, after the preprocessing, a preliminary segmentation of the MRI image to assign a tissue label of a set of tissue labels to one or more preliminary volumes of voxels of the MRI image;
comparing each voxel of the MRI image with the one or more preliminary volumes of voxels with an assigned tissue label and assigning each voxel of the MRI image a probability of being associated with each tissue label of the set of tissue labels; and
assigning each voxel of the MRI image a tissue label according to its greatest probability among probabilities for each voxel being associated with the set of tissue labels,
wherein the comparing and assigning is performed using a classifier trained on a subject-by-subject basis that segments each patient according to his or her own subject-specific classifier by using both intensity and spatial data from each voxel, and
wherein a weighted random sampling of the one or more preliminary volumes of voxels of the MRI image is used to train the classifier such that weights for sampling reflect a relative distribution of voxels assigned to tissue labels from preliminary segmentation.

2. The method of claim 1, wherein the comparing and assigning comprises:
training the classifier using the voxels of the one or more preliminary volumes with the assigned tissue label; and
assigning by the classifier each voxel of the MRI image a probability of membership for each tissue label.

3. The method of claim 1, further comprising:
filtering the MRI image to remove any clusters of voxels that have fewer than a certain number of continuous voxels.

4. The method of claim 1, wherein the set of tissue labels includes: contrast enhancing (CE), fluid-attenuated inversion recovery hyperintensity (FH), gray matter (GM), white matter (WM), cerebral spinal fluid (CSF), and blood vessel (BV).

5. The method of claim 1, wherein the preprocessing the MRI image to correct any distortions includes skull stripping and registration to Montreal Neurological Institute (MNI) templates.

6. The method of claim 2, wherein the classifier comprises a k-nearest neighbor (KNN) probabilistic classifier and a Gaussian mixture model (GMM) probabilistic classifier.

7. The method of claim 1, wherein the one or more preliminary volumes are derived by trained human operators and wherein the comparing includes:
assessing a similarity between volumes by dividing a sum of intersection between a voxel being compared and the one or more preliminary volumes with values of volumes of the voxel being compared and the one or more preliminary volume.

8. A system for processing a magnetic resonance imaging (MRI) image, including:
an MRI machine that obtains an MRI image of a subject; and
a processor that includes multiple components for processing the MRI image, including:
a component that corrects distortions in the MRI image;
a component that performs a preliminary segmentation of the MRI image to assign a tissue label of a set of tissue labels to one or more preliminary volumes of voxels of the MRI image;
a component that compares each voxel of the MRI image with the one or more preliminary volumes of voxels with an assigned tissue label and assigning each voxel of the MRI image a probability of being associated with each tissue label of the set of tissue labels; and a component that assigns each voxel of the MRI image a tissue label according to its greatest probability among probabilities for each voxel being associated with the set of tissue labels, wherein the comparing and assigning is performed using a classifier trained on a subject-by-subject basis that segments each patient according to his or her own subject-specific classifier by using both intensity and spatial data from each voxel, and wherein a weighted random sampling of the one or more preliminary volumes of voxels of the MRI image is used to train the classifier such that weights for sampling reflect a relative distribution of voxels assigned to tissue labels from preliminary segmentation.

9. The system of claim 8, wherein the component that compares includes:
   a component that trains the classifier using the voxels of the one or more preliminary volumes with the assigned tissue label; and
   a component that assigns by the classifier each voxel of the MRI image a probability of membership for each tissue label.

10. The system of claim 8, wherein the processor further includes:
    a component that filters the MRI image to remove any clusters of voxels that have fewer than a certain number of continuous voxels.

11. The system of claim 8, wherein the set of tissue labels includes:
    contrast enhancing (CE), fluid-attenuated inversion recovery hyperintensity (FH), gray matter (GM), white matter (WM), cerebral spinal fluid (CSF), and blood vessel (BV).

12. The system of claim 8, wherein the component that processes the MRI image to correct any distortions includes a component for skull stripping and registration to Montreal Neurological Institute (MNI) templates.

13. The system of claim 9, wherein the classifier comprises a k-nearest neighbor (KNN) probabilistic classifier and a Gaussian mixture model (GMM) probabilistic classifier.

14. The system of claim 8, wherein the one or more preliminary volumes are derived by trained human operators and wherein the component that compares includes:
    a component that assesses a similarity between volumes by dividing a sum of intersection between a voxel being compared and the one or more preliminary volumes with values of volumes of the voxel being compared and the one or more preliminary volume.

15. A computer program product comprising a non-transitory computer readable medium having code stored thereupon, the code, when executed by a processor, causing the processor to implement a method for processing a magnetic resonance imaging (MRI) image, comprising:
    code for preprocessing the MRI image to correct distortions;
    code for performing, after the preprocessing, a preliminary segmentation of the MRI image to assign a tissue label of a set of tissue labels to one or more preliminary volumes of voxels of the MRI image;
    code for comparing each voxel of the MRI image with the one or more preliminary volumes of voxels with an assigned tissue label and assigning each voxel of the MRI image a probability of being associated with each tissue label of the set of tissue labels; and
    code for assigning each voxel of the MRI image a tissue label according to its greatest probability among probabilities for each voxel being associated with the set of tissue labels,
    wherein the comparing and assigning is performed using a classifier trained on a subject-by-subject basis that segments each patient according to his or her own subject-specific classifier by using both intensity and spatial data from each voxel, and
    wherein a weighted random sampling of the one or more preliminary volumes of voxels of the MRI image is used to train the classifier such that weights for sampling reflect a relative distribution of voxels assigned to tissue labels from preliminary segmentation.

16. The computer program product of claim 15, wherein the code for comparing and assigning comprises:
    code for training the classifier using the voxels of the one or more preliminary volumes with the assigned tissue label; and
    code for assigning by the classifier each voxel of the MRI image a probability of membership for each tissue label.

17. The computer program product of claim 15, wherein the code further comprises:
    code for filtering the MRI image to remove any clusters of voxels that have fewer than a certain number of continuous voxels.

18. The computer program product of claim 15, wherein the set of tissue labels includes: contrast enhancing (CE), fluid-attenuated inversion recovery hyperintensity (FH), gray matter (GM), white matter (WM), cerebral spinal fluid (CSF), and blood vessel (BV).

19. The computer program product of claim 15, wherein the code for preprocessing the MRI image to correct any distortions includes code for skull stripping and registration to Montreal Neurological Institute (MNI) templates.

20. The computer program product of claim 16, wherein the classifier comprises a k-nearest neighbor (KNN) probabilistic classifier and a Gaussian mixture model (GMM) probabilistic classifier.

21. The computer program product of claim 15, wherein the one or more preliminary volumes are derived by trained human operators and wherein the code for comparing includes:
    code for assessing a similarity between volumes by dividing a sum of intersection between a voxel being compared and the one or more preliminary volumes with values of volumes of the voxel being compared and the one or more preliminary volume.

* * * * *